United States Patent
Schwab et al.

(10) Patent No.: US 9,230,794 B2
(45) Date of Patent: Jan. 5, 2016

(54) PROCESS FOR CLEANING, DRYING AND HYDROPHILIZING A SEMICONDUCTOR WAFER

(75) Inventors: Guenter Schwab, Neuoetting (DE); Clemens Zapilko, Burghuasen (DE); Thomas Buschhardt, Burghausen (DE); Diego Feijoo, Burghausen (DE)

(73) Assignee: SILTRONIC AG, Munich (DE)

( * ) Notice: Subject to any disclaimer, the term of this patent is extended or adjusted under 35 U.S.C. 154(b) by 1276 days.

(21) Appl. No.: 12/134,378

(22) Filed: Jun. 6, 2008

(65) Prior Publication Data

US 2008/0308122 A1 Dec. 18, 2008

(30) Foreign Application Priority Data

Jun. 13, 2007 (DE) .................. 10 2007 027 112

(51) Int. Cl.
*H01L 21/02* (2006.01)
*C30B 29/16* (2006.01)
*C30B 33/00* (2006.01)

(52) U.S. Cl.
CPC .......... *H01L 21/02052* (2013.01); *C30B 29/16* (2013.01); *C30B 33/00* (2013.01)

(58) Field of Classification Search
CPC .... H01L 21/02052; C30B 29/16; C30B 33/00
USPC ............. 134/2, 3, 26, 28, 33, 34, 30, 37, 902
See application file for complete search history.

(56) References Cited

U.S. PATENT DOCUMENTS

| 5,714,203 | A | 2/1998 | Schellenberger et al. |
| 6,295,998 | B1 | 10/2001 | Kudelka et al. |
| 6,451,124 | B1 | 9/2002 | Brunner |
| 6,869,487 | B1 | 3/2005 | Bergman |
| 2003/0205254 | A1 * | 11/2003 | Bergman et al. ........... 134/100.1 |
| 2004/0103915 | A1 | 6/2004 | Verhaverbeke et al. |
| 2004/0103919 | A1 | 6/2004 | Kenny et al. |
| 2005/0034745 | A1 | 2/2005 | Bergman |
| 2005/0072446 | A1 * | 4/2005 | Bergman ......................... 134/2 |

FOREIGN PATENT DOCUMENTS

| DE | 198 01 360 A1 | 7/1999 |
| EP | 0 905 747 A1 | 3/1999 |
| JP | 07056323 A | 3/1995 |
| JP | 20010533050 A | 2/2001 |

OTHER PUBLICATIONS

English Derwent Abstract AN 1999-406082 corresponding to DE 19801360.

* cited by examiner

*Primary Examiner* — Alexander Markoff
(74) *Attorney, Agent, or Firm* — Brooks Kushman P.C.

(57) ABSTRACT

Semiconductor wafers are cleaned, dried, and hydrophilized the following steps in the order stated:

a) treating the semiconductor wafer with a liquid aqueous solution containing hydrogen fluoride, the semiconductor wafer rotating about its center axis at least occasionally, and b) drying the semiconductor wafer by rotation of the semiconductor wafer about its center axis at a rotational speed of 1000 to 5000 revolutions per minute in an ozone-containing atmosphere, the liquid aqueous solution containing hydrogen fluoride flowing away from the semiconductor wafer on account of the centrifugal force generated by the rotation, and the surface of the semiconductor wafer being hydrophilized by ozone.

10 Claims, No Drawings

PROCESS FOR CLEANING, DRYING AND HYDROPHILIZING A SEMICONDUCTOR WAFER

BACKGROUND OF THE INVENTION

1. Field of the Invention

The invention relates to a process for cleaning, drying and simultaneously hydrophilizing a semiconductor wafer, the drying taking place with rotation of the semiconductor wafer.

2. Background Art

Semiconductor wafers which serve, for example, as substrates for the production of microelectronic components, usually silicon wafers, are cleaned by wet chemical processes after polishing, coating (for example by epitaxial deposition) or thermal treatment steps ("annealing") or before high-temperature process steps. The aim of cleaning is to remove contaminants of the semiconductor wafers, for example metals such as copper or organic substances, and also particles adhering to the wafer surface. All these should be removed as completely as possible, since the contaminants lead to problems during subsequent production of components, as two examples, an inhomogeneous growth of gate oxides or an inhomogeneous deposition of polysilicon gates.

A number of processes for cleaning and drying semiconductor wafers are known in the prior art:

U.S. Pat. No. 5,714,203 discloses a process in which a semiconductor wafer immersed completely into a bath comprising a hydrogen fluoride solution (hydrofluoric acid) is slowly withdrawn from the bath into an ozone-containing atmosphere. The ozone from the atmosphere dissolves at the liquid surface and thus reduces the surface tension thereof, which makes it easier for the liquid to flow away from the wafer surface. At the same time, the wafer surface is oxidized by the ozone-containing atmosphere. The wafer is therefore hydrophilic after drying. It was established in U.S. Pat. No. 6,451,124 that the semiconductor wafer is permitted to be withdrawn from the hydrofluoric acid at a speed of only 0.01 to 15 mm per second, and preferably 0.01 to 0.5 mm per second, in order actually to achieve a dry wafer surface. Given a wafer diameter of 300 mm and a speed of 0.5 mm per second, this procedure alone requires 10 minutes. The wafer must be fully dry since inhomogenities are otherwise observed on the wafer surface, for example so called "watermarks".

For some years cleaning processes for individual wafers have also been increasingly employed, in which a semiconductor wafer is caused to rotate rapidly about its center axis and is firstly cleaned with one or more liquids, then rinsed with deionized water and dried. The liquids are applied to the rotating semiconductor wafer and accelerated towards the edge of the wafer by the centrifugal force, such that the liquids flow away outwards and form a generally whole-area thin film on the wafer surface. During subsequent drying with further rotation of the semiconductor wafer, for example with addition of a vapor that reduces the surface tension of the liquid film (e.g. isopropanol), the liquid film completely flows away afterwards. Processes of this type are described in US2004/0103915A1 and EP0905747A1. Individual-wafer cleaning processes of this type are distinguished by a lower consumption of chemicals.

It is also known to use hydrofluoric acid as a cleaning liquid in such devices. Thus, U.S. Pat. No. 6,869,487 B1 describes a process in which a semiconductor wafer is cleaned with a liquid with rapid rotation, the liquid containing dissolved ozone which was either dissolved previously in the liquid or originates from an ozone-containing process atmosphere. A hydrophilic surface can be achieved by ozone furthermore being added to the process atmosphere after the supply of liquid has already been stopped. However, care should be taken to ensure that a closed liquid film is always present on the wafer surface as long as it is in contact with ozone. The semiconductor wafer is subsequently rinsed with deionized water and dried. The drying is effected, for example, by centrifugal drying with addition of isopropanol vapor.

SUMMARY OF THE INVENTION

It has been found, however, that the concentration of the particles, metals and organic contaminants on the surface of the semiconductor wafers treated in this way is still in need of improvement. Therefore, an object of the invention was to provide a cleaning and drying method which overcomes these disadvantages. These and other objects have been surprisingly achieved by a two step process in which hydrofluoric acid is applied to a rotating wafer in a first step, and in a second step, the wafer is dried by rotation at a high rotational speed in the presence of an ozone-containing atmosphere, and simultaneously hydrophilicized.

DETAILED DESCRIPTION OF THE PREFERRED EMBODIMENT(S)

Thus, the invention is directed to a process for cleaning, drying and hydrophilizing a semiconductor wafer, comprising the following steps in the order stated:

a) treating the semiconductor wafer with a liquid aqueous solution containing hydrogen fluoride, the semiconductor wafer rotating about its center axis at least occasionally, and b) drying the semiconductor wafer by rotation of the semiconductor wafer about its center axis at a rotational speed of 1000 to 5000 revolutions per minute in an ozone-containing atmosphere, the liquid aqueous solution containing hydrogen fluoride flowing away from the semiconductor wafer on account of the centrifugal force generated by the rotation and the surface of the semiconductor wafer being hydrophilized by ozone.

The semiconductor wafer, covered with an HF-containing cleaning solution, is dried in an ozone-containing gas atmosphere with rotation of the semiconductor wafer. Drying and surface hydrophilization take place in a single process step. The process is suitable in particular for application in an individual-wafer cleaning device such as is known for example from US2004/0103915A1. In contrast to known spin drying processes, the use of a separate rinsing medium, e.g. deionized water, and organic solvents such as isopropanol are dispensed with. It has been shown that the rinsing with deionized water that is required in accordance with U.S. Pat. No. 6,869,487 B1 again increases the concentration of the particles and metallic contaminants on the wafer surface and, moreover, leads to the formation of so-called "watermarks". Watermarks occur if rinsing water is not removed completely and uniformly, but rather remains at some locations on the semiconductor wafer. These residues then dry in an uncontrolled manner. In this case, all the contaminants present in the rinsing water deposit on the semiconductor wafer and form "watermarks". In particular silicon dioxide, traces of which are dissolved in the water, deposits as one particular contamination. Therefore, the rinsing step with water is dispensed with according to the invention, even though this rinsing step was described as necessary in the prior art. At the same time, the process of the invention also makes it possible to dispense with organic compounds such as isopropanol which again lead to organic contamination after cleaning.

A further advantage is the saving of the deionized water and isopropanol processing chemicals. In particular, costs for the environmentally compatible disposal of organic waste are avoided. Moreover, the process according to the invention entails a significant shortening of the process duration in comparison with a conventional three-stage process comprising hydrophilizing, rinsing and drying.

Unlike the HF-ozone dryer known from U.S. Pat. No. 5,714,203, the inventive process is not a bath process, but rather an individual-wafer process in which the process chemicals are distributed on the rotating semiconductor wafer by means of at least one nozzle. This type of process implementation is extremely advantageous since the drying process can be integrated into a multistage individual-wafer cleaning sequence with minimal handling outlay.

Step a)

In step a) of the process according to the invention, the wafer surface is treated with a liquid aqueous solution containing hydrogen fluoride (hydrofluoric acid). Preferably, the solution is applied, for example sprayed, onto the semiconductor wafer through one or more nozzles while the semiconductor wafer is caused to rotate by means of a holding device. As a result of the centrifugal force, the liquid flows away outwards and in this case forms a thin film on the surface of the semiconductor wafer. The semiconductor wafer is generally mounted horizontally in such a way that it can be rotated about a vertical axis. The liquids are fed to it generally from above and, if appropriate, simultaneously from below.

The concentration of the hydrogen fluoride in the liquid aqueous solution is preferably 0.001 to 50 percent by weight, more preferably 0.01 to 2 percent by weight. At an HF concentration of less than 0.001% complete dissolution of the oxide layer on the semiconductor wafer is no longer ensured. Highly concentrated hydrofluoric acid is very corrosive; therefore, according to the invention, a concentration of not more than 50% and preferably of not more than 2% is used. Optionally, other cleaning chemicals such as hydrogen chloride may also be present in the solution. Hydrogen chloride together with metal cations forms readily soluble complex compounds which are removed together with the hydrogen fluoride solution.

It is also possible to add ozone to the solution before it is fed to the semiconductor wafer. The concentration of the ozone when this is done is preferably at least 0.1 mg/l. As a result, the cleaning effect of the solution is increased and the surface tension of the liquid film is reduced.

Step a) can be carried out for example in clean room air or under an inert atmosphere such as nitrogen. However, it is also possible for ozone already to be added to the atmosphere in step a). Ozone is preferably supplied in a continuous gas stream as an $O_3/O_2$ mixture. In step a) the gas stream preferably contains 1 to 35 percent by weight of ozone; the range from 5 to 20 percent by weight is particularly preferred. If the atmosphere contains ozone, then the latter dissolves in the liquid film and passes by diffusion to the surface of the semiconductor wafer, which is thereby oxidized. The ozone-containing atmosphere can be used as an alternative to the ozone-containing solution or in addition. A solution containing ozone and HF is able to etch the semiconductor wafer by continual dissolution and reformation of an oxide layer. This facilitates the removal of particles and is advantageous if a thicker surface layer is to be removed. At the same time, the reductive deposition of metals on the semiconductor surface is prevented in the presence of a strong oxidizing agent such as ozone. A cleaning solution which contains only hydrogen fluoride and no oxidizing agent selectively removes only the thin oxide layer on the wafer surface and does not have an etching effect for elemental silicon. This is advantageous for semiconductor wafers having stringent requirements for surface roughness.

Step b)

At the end of step a), the surface of the semiconductor wafer is covered with a thin aqueous liquid film containing hydrogen fluoride and, if appropriate, further components, for example hydrogen chloride or ozone. According to the invention, the concentration of the hydrogen fluoride in the liquid aqueous solution which is situated on the surface of the semiconductor wafer after step a) is not changed before step b); in particular, the semiconductor wafer is not rinsed with water or other liquids before drying.

An ozone-containing gas mixture flows through the gas space above the semiconductor wafer in step b). By way of example, ozone in a mixture with oxygen ($O_2$) or air is used. Ozone is preferably supplied in a continuous gas stream as an $O_3/O_2$ mixture. The concentration of the ozone in the gas stream in step b) is preferably 5 to 35 percent by weight, more preferably 5 to 20 percent by weight. At this ozone concentration, on the one hand a complete hydrophilization of the wafer surface is ensured and, on the other hand, the surface tension of the liquid film is reduced by dissolved ozone sufficiently to obtain entirely satisfactory drying.

The ozone from the atmosphere partly dissolves in the liquid film and reduces the surface tension of the liquid. The semiconductor wafer is rotated rapidly, whereby the liquid film flows away under the action of centrifugal forces. The rotational speed should be chosen to be high enough for the liquid to be centrifuged away fully from the wafer surface. This can be achieved by means of a rotational speed of 1000 to 5000 revolutions per minute, preferably of 2000 to 3000 revolutions per minute. Only if these rotational speeds are complied with is the rinsing with water that is necessary in accordance with the prior art able to be dispensed with.

The addition of ozone into the gas space preferably begins with the end of the liquid supply in step a) and simultaneously with the increase in the rotational speed of the semiconductor wafer. It is also possible to add ozone later if the thickness of the liquid film has already been reduced by the rotary movement. For complete and uniform removal of the liquid, however, it is necessary to apply ozone to the gas space as long as a closed liquid film is still present on the wafer. The entire cleaning and drying process can be carried out in less than 30 seconds.

During the drying of the semiconductor wafer, the ozone containing gas atmosphere comes into contact with the wafer surface and forms a hydrophilic oxide layer, such that, at the end of step b), the semiconductor wafer is hydrophilic and dry. The dried wafer is free of watermarks. Since the process according to the invention does not result in an increase in the metal and particle concentration on the wafer surface, the semiconductor wafers treated according to the invention are distinguished by a low metal and particle concentration.

The process according to the invention can be applied to all semiconductor wafers, preferably to monocrystalline silicon wafers. Application to semiconductor wafers which do not as yet bear any component structures is also preferred.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for cleaning, drying and hydrophilizing a semiconductor wafer, comprising the following steps in the order stated:
   a) applying a liquid aqueous solution containing hydrogen fluoride onto the semiconductor wafer while the semiconductor wafer is caused to rotate about its center axis at least occasionally, so that the liquid aqueous solution containing hydrogen fluoride flows away outwards and forms a continuous liquid film on the semiconductor wafer, and
   b) directly following step a), completely drying the semiconductor wafer by rotation of the semiconductor wafer about its center axis at a rotational speed of 1000 to 5000 revolutions per minute in an ozone-containing atmosphere having a concentration of ozone of 5 to 20 percent by weight, the liquid aqueous solution containing hydrogen fluoride flowing away from the semiconductor wafer on account of the centrifugal force generated by the rotation, and the surface of the semiconductor wafer being hydrophilized by ozone, wherein the semiconductor wafer is exposed to the ozone-containing atmosphere starting from a point in time at which the semiconductor wafer is still covered with the continuous liquid film, and continues until the semiconductor wafer is completely dry.

2. The process of claim 1, wherein the rotational speed in step b) is 2000 to 3000 revolutions per minute.

3. The process of claim 1, wherein the concentration of the hydrogen fluoride in the liquid aqueous solution in steps a) and b) is 0.01 to 2 percent by weight.

4. The process of claim 2, wherein the concentration of the hydrogen fluoride in the liquid aqueous solution in steps a) and b) is 0.01 to 2 percent by weight.

5. The process of claim 3, wherein the concentration of the hydrogen fluoride in the liquid aqueous solution which is situated on the surface of the semiconductor wafer after step a) is not changed before step b).

6. The process of claim 1, wherein step a) is carried out under an ozone-containing atmosphere.

7. The process of claim 6, wherein concentration of ozone in the atmosphere in step a) is 5 to 20 percent by weight.

8. The process of claim 1, wherein the liquid aqueous solution contains ozone.

9. The process of claim 1, wherein that the process is carried out by means of an individual-wafer cleaning device.

10. The process of claim 1, wherein following step a), no rinsing of the wafer occurs.

* * * * *